US012628598B2

(12) United States Patent　　(10) Patent No.:　US 12,628,598 B2

Suzuki　　(45) Date of Patent:　May 12, 2026

(54) METHOD OF MANUFACTURING SEMICONDUCTOR DEVICE

(71) Applicants:Kabushiki Kaisha Toshiba, Tokyo (JP); Toshiba Electronic Devices & Storage Corporation, Tokyo (JP)

(72) Inventor:　Takeyuki Suzuki, Kaga Ishikawa (JP)

(73) Assignees: Kabushiki Kaisha Toshiba, Kawasaki (JP); Toshiba Electronic Devices & Storage Corporation, Kawasaki (JP)

( * ) Notice:　Subject to any disclaimer, the term of this patent is extended or adjusted under 35 U.S.C. 154(b) by 444 days.

(21) Appl. No.: 18/237,378

(22) Filed:　Aug. 23, 2023

(65)　　　　Prior Publication Data

US 2024/0321638 A1　　Sep. 26, 2024

(30)　　　Foreign Application Priority Data

Mar. 22, 2023　(JP) ................................. 2023-044971

(51) Int. Cl.
| | |
|---|---|
| *H01L 21/78* | (2006.01) |
| *H01L 21/683* | (2006.01) |
| *H10D 30/01* | (2025.01) |

(52) U.S. Cl.
CPC .......... *H01L 21/78* (2013.01); *H01L 21/6836* (2013.01); *H10D 30/0291* (2025.01)

(58) Field of Classification Search
CPC ................. H01L 21/78; H01L 21/6836; H01L 2221/68327; H01L 2221/6834;

(Continued)

(56)　　　　References Cited

U.S. PATENT DOCUMENTS

| 8,445,360 B2 | 5/2013 | Nakanishi et al. |
| 8,748,316 B2 * | 6/2014 | Shirono ................ H10F 39/806 |
| | | 438/692 |

(Continued)

FOREIGN PATENT DOCUMENTS

| JP | 2011-171647 A | 9/2011 |
| JP | 5571409 B2 | 8/2014 |

(Continued)

OTHER PUBLICATIONS

Office Action issued in Japanese Patent Application No. 2023-044971 dated Feb. 24, 2026, in 7 pages.

*Primary Examiner* — Thanh T Nguyen

(74) *Attorney, Agent, or Firm* — Knobbe, Martens, Olson & Bear, LLP

(57)　　　　ABSTRACT

A method of manufacturing a semiconductor device according to an embodiment includes: the method of manufacturing a semiconductor device from a substrate and a sheet, the substrate including a semiconductor substrate including a first part including a first surface and a second surface provided on the opposite side of the first surface, and an annular second part surrounding the second surface and protruding from the second surface in a direction perpendicular to the second surface, and a first conductive film provided in contact with a top surface and an inner side surface of the second part, and the second surface, the sheet being attached to the first conductive film provided in contact with the top surface and the inner side surface of the second part, and the second surface; the method comprising: separating the second part from the first part by pressing a polishing tape against the first surface provided on the opposite side of the second part and polishing the semiconductor substrate; and cutting the first conductive film between the first part and the separated second part by (Continued)

pressing the polishing tape against the first conductive film between the first part and the separated second part.

11 Claims, 13 Drawing Sheets

(58) Field of Classification Search
CPC ............. H01L 21/304; H01L 21/32115; H01L 21/67132; H10D 30/0291
See application file for complete search history.

(56) References Cited

U.S. PATENT DOCUMENTS

| | | | |
|---|---|---|---|
| 2006/0115986 A1* | 6/2006 | Donohoe | .......... H01L 21/76251 |
| | | | 438/690 |
| 2007/0000873 A1* | 1/2007 | Kubota | ................. H01L 21/302 |
| | | | 216/88 |
| 2008/0293221 A1* | 11/2008 | Yamamoto | ........ H01L 21/67132 |
| | | | 438/464 |
| 2011/0207294 A1 | 8/2011 | Nakanishi et al. | |
| 2018/0033694 A1 | 2/2018 | Ueno et al. | |
| 2020/0066569 A1* | 2/2020 | Priewasser | ........... H01L 21/304 |
| 2021/0134619 A1 | 5/2021 | Sekiya | |
| 2022/0267920 A1 | 8/2022 | Suzuki | |

FOREIGN PATENT DOCUMENTS

| | | | |
|---|---|---|---|
| JP | 2017-073438 A | 4/2017 | |
| JP | 6121225 B2 | 4/2017 | |
| JP | 2021-072353 A | 5/2021 | |
| JP | 2021-174896 A | 11/2021 | |
| JP | 2022-036498 A | 3/2022 | |
| JP | 2022-128843 A | 9/2022 | |

* cited by examiner

Fig.9

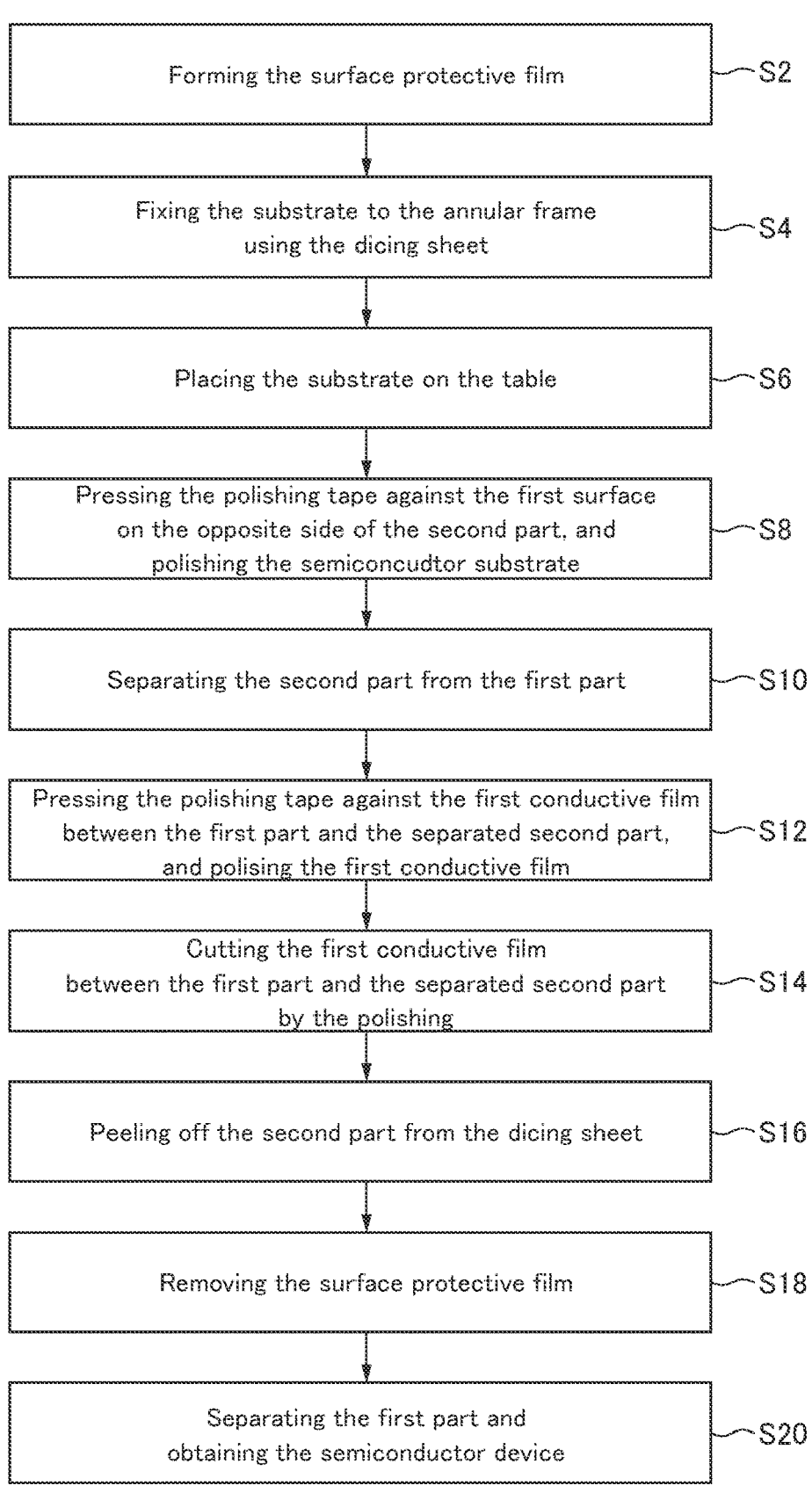

Forming the surface protective film ——S2

Fixing the substrate to the annular frame
using the dicing sheet ——S4

Placing the substrate on the table ——S6

Pressing the polishing tape against the first surface
on the opposite side of the second part, and
polishing the semiconcudtor substrate ——S8

Separating the second part from the first part ——S10

Pressing the polishing tape against the first conductive film
between the first part and the separated second part,
and polising the first conductive film ——S12

Cutting the first conductive film
between the first part and the separated second part
by the polishing ——S14

Peeling off the second part from the dicing sheet ——S16

Removing the surface protective film ——S18

Separating the first part and
obtaining the semiconductor device ——S20

Fig.13

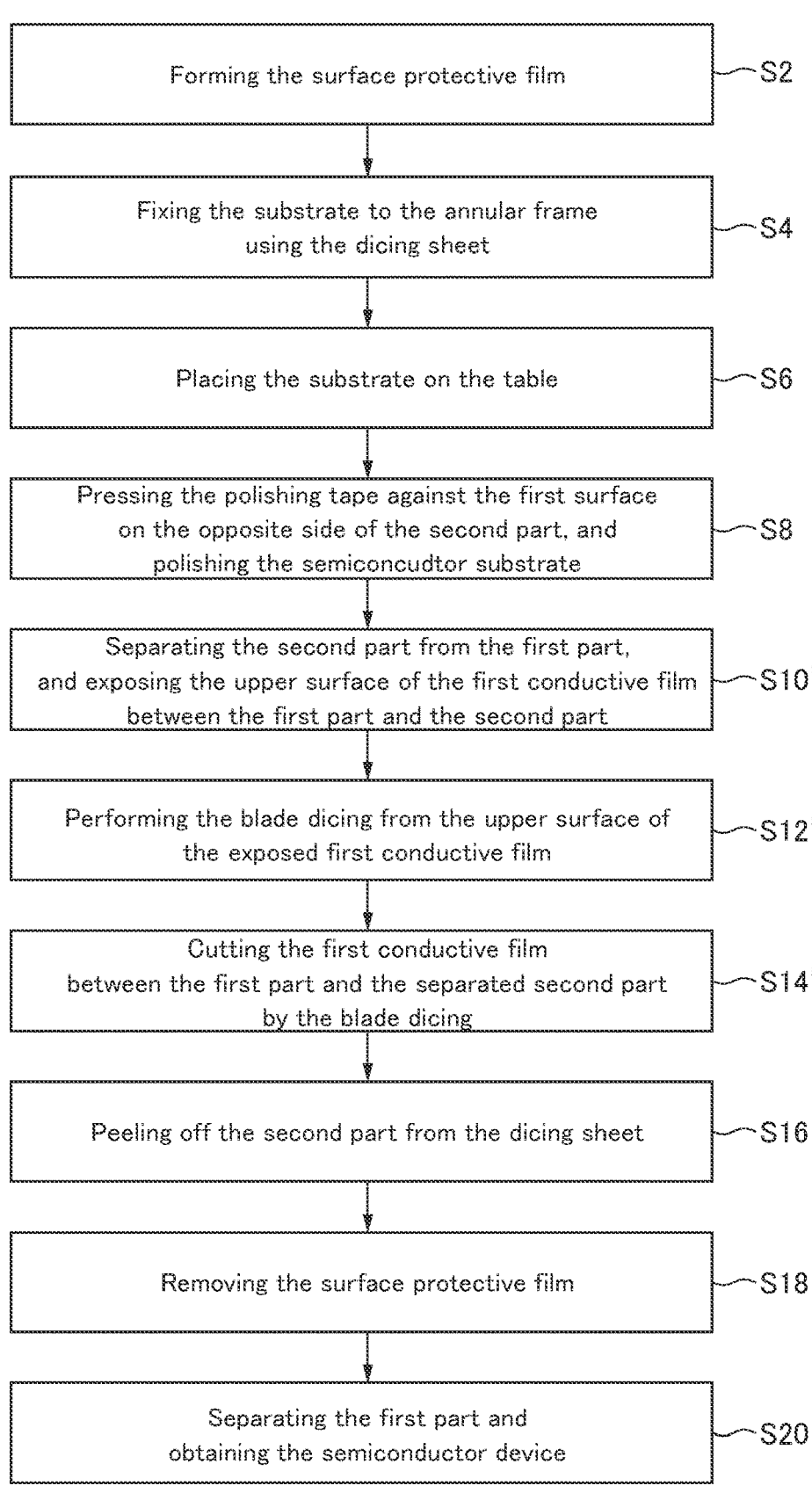

Forming the surface protective film — S2

Fixing the substrate to the annular frame
using the dicing sheet — S4

Placing the substrate on the table — S6

Pressing the polishing tape against the first surface
on the opposite side of the second part, and
polishing the semiconcudtor substrate — S8

Separating the second part from the first part,
and exposing the upper surface of the first conductive film
between the first part and the second part — S10'

Performing the blade dicing from the upper surface of
the exposed first conductive film — S12'

Cutting the first conductive film
between the first part and the separated second part
by the blade dicing — S14'

Peeling off the second part from the dicing sheet — S16

Removing the surface protective film — S18

Separating the first part and
obtaining the semiconductor device — S20

METHOD OF MANUFACTURING SEMICONDUCTOR DEVICE

CROSS-REFERENCE TO RELATED APPLICATION

This application is based upon and claims the benefit of priority from Japanese Patent Application No. 2023-044971, filed on Mar. 22, 2023, the entire contents of which are incorporated herein by reference.

FIELD

Embodiments described herein relate generally to a method for manufacturing a semiconductor device.

BACKGROUND

Semiconductor devices such as a MOSFET (Metal Oxide Semiconductor Field Effect Transistor) are used in applications for power conversion. The semiconductor chip including the MOSFET is obtained by dicing the semiconductor substrate on which the MOSFET is formed.

BRIEF DESCRIPTION OF THE DRAWINGS

FIG. 9 is a flow chart illustrating the method of manufacturing the semiconductor device according to the first embodiment.

FIG. 13 is a flow chart illustrating the method of manufacturing the semiconductor device according to the second embodiment.

DETAILED DESCRIPTION

Figure 1:
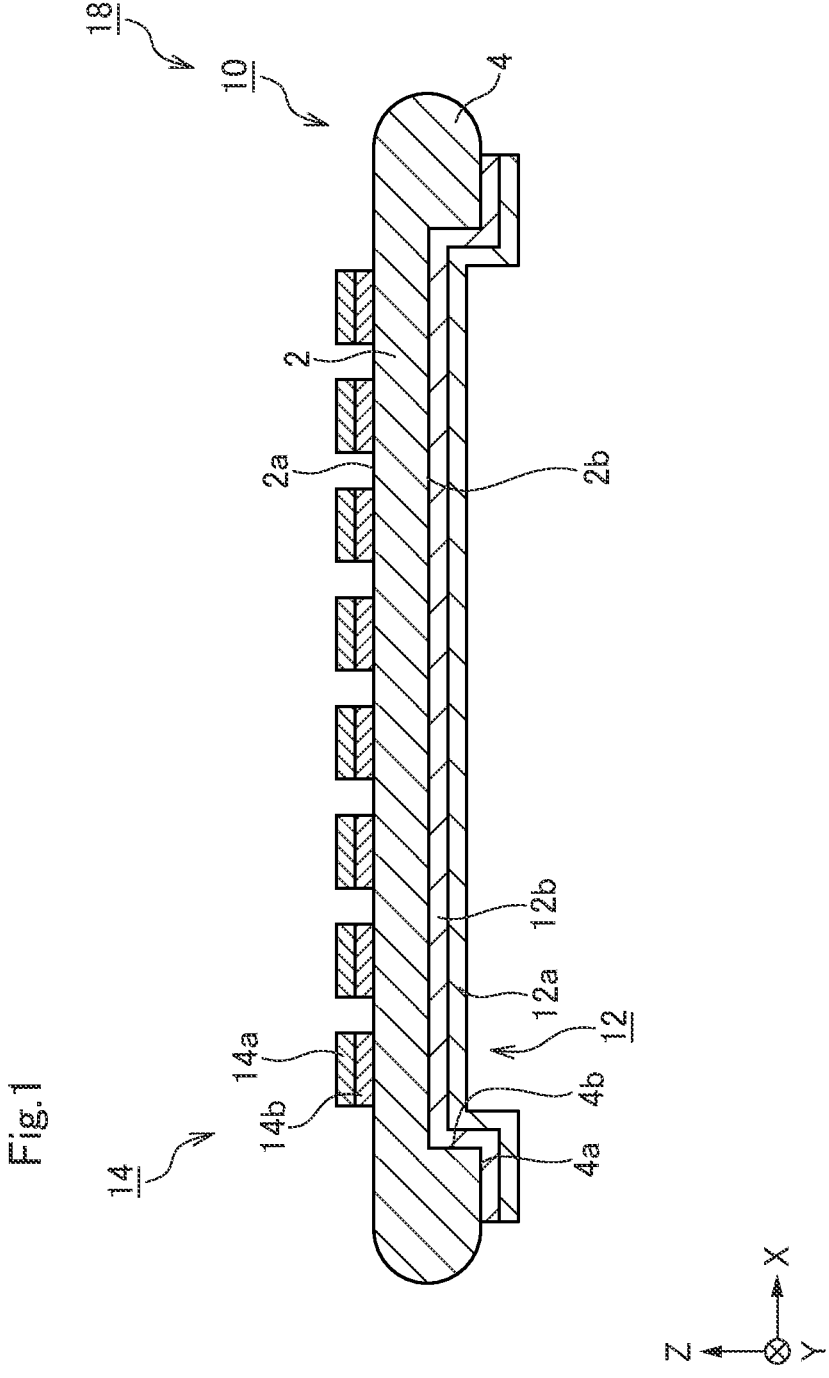
FIG. 1 is a schematic cross-sectional view of a substrate according to a first embodiment.

A method of manufacturing a semiconductor device according to an embodiment includes: the method of manufacturing a semiconductor device from a substrate and a sheet, the substrate including a semiconductor substrate including a first part including a first surface and a second surface provided on the opposite side of the first surface, and an annular second part surrounding the second surface and protruding from the second surface in a direction perpendicular to the second surface, and a first conductive film provided in contact with a top surface and an inner side surface of the second part, and the second surface, the sheet being attached to the first conductive film provided in contact with the top surface and the inner side surface of the second part, and the second surface; the method comprising: separating the second part from the first part by pressing a polishing tape against the first surface provided on the opposite side of the second part and polishing the semiconductor substrate; and cutting the first conductive film between the first part and the separated second part by pressing the polishing tape against the first conductive film between the first part and the separated second part.

Hereinafter, embodiments of the present disclosure will be described with reference to the drawings. Note that in the following description, the same members and the like are denoted by the same reference numerals, and description of members and the like once described is appropriately omitted.

In this specification, in order to illustrate the positional relationship of parts and the like, the upward direction of the drawings may be referred to as "upper", and the downward direction of the drawings may be referred to as "lower". Here, the terms "up" and "down" do not necessarily indicate a relationship with the direction of gravity.

First Embodiment

A method of manufacturing a semiconductor device according to the present embodiment includes: the method of manufacturing a semiconductor device from a substrate and a sheet, the substrate including a semiconductor substrate including a first part including a first surface and a second surface provided on the opposite side of the first surface, and an annular second part surrounding the second surface and protruding from the second surface in a direction perpendicular to the second surface, and a first conductive film provided in contact with a top surface and an inner side surface of the second part, and the second surface, the sheet being attached to the first conductive film provided in contact with the top surface and the inner side surface of the second part, and the second surface; the method comprising: separating the second part from the first part by pressing a polishing tape against the first surface provided on the opposite side of the second part and polishing the semiconductor substrate; and cutting the first conductive film between the first part and the separated second part by pressing the polishing tape against the first conductive film between the first part and the separated second part.

FIG. 1 is the schematic cross-sectional view of the substrate 18 according to the present embodiment.

Figure 2:
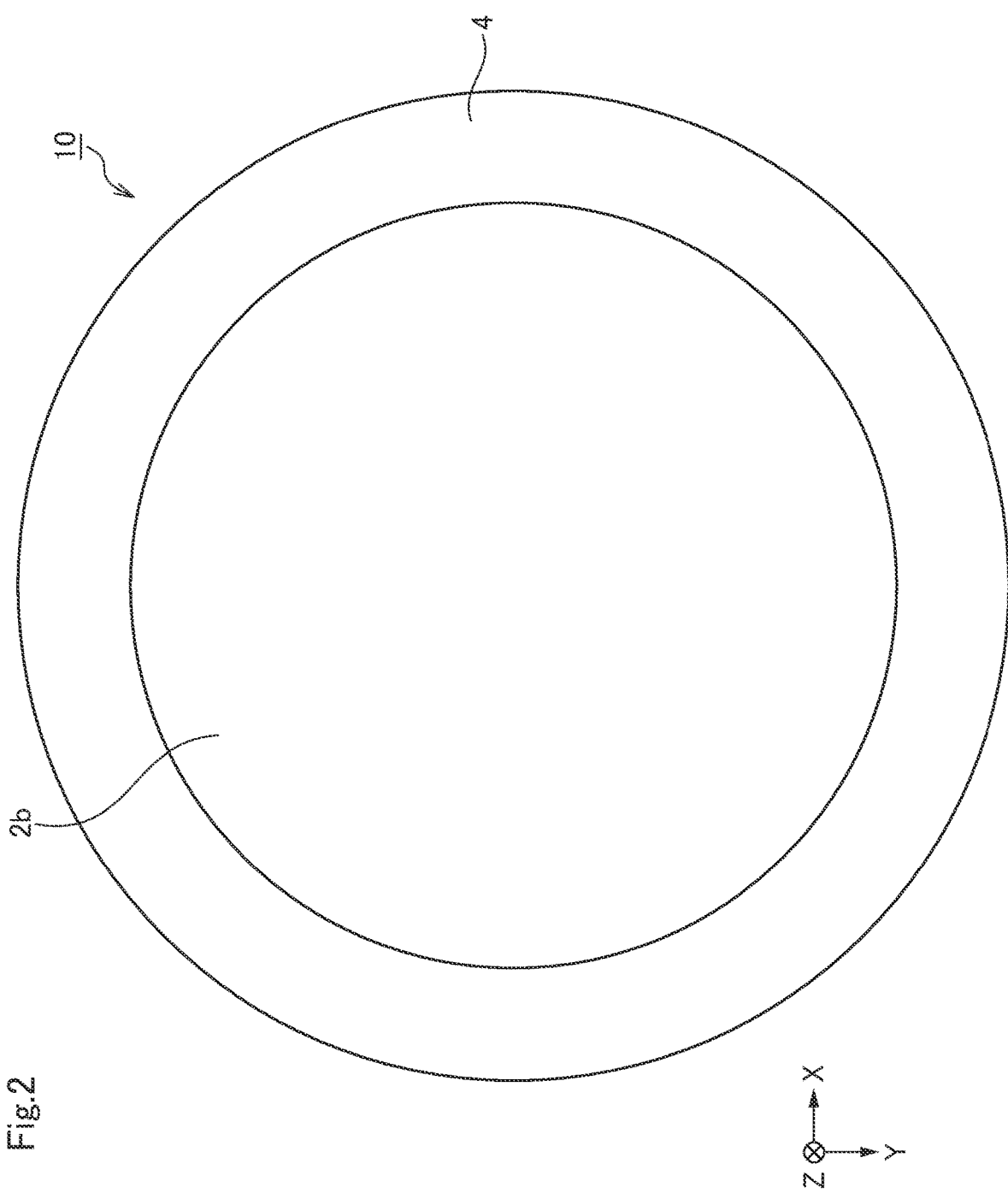
FIG. 2 is a schematic bottom view of a semiconductor substrate according to the first embodiment.

FIG. 2 is the schematic bottom view of the semiconductor substrate 10 according to a first embodiment. In FIG. 2, a first conductive film 12 is not shown.

The method of manufacturing the semiconductor device according to the present embodiment is a method for manufacturing the semiconductor device (the semiconductor chip) 100 in which a part of the substrate 18 is separated by the dicing of the substrate 18 shown in FIG. 1.

The substrate 18 includes the semiconductor substrate 10, the first conductive film 12, and a second conductive film 14.

Here, an X direction, a Y direction perpendicular to the X direction, and a Z direction perpendicular to the X direction and the Y direction are defined. FIG. 2 is a view of the semiconductor substrate 10 of the present embodiment as viewed from the −Z-direction.

The semiconductor substrate 10 includes a semiconducting material. Examples of the semiconductive material include, but are not limited to, Si (silicon), SiC (silicon carbide), GaAs (gallium arsenide), and GaN (gallium nitride).

The semiconductor substrate 10 is the substrate with semiconducting devices, such as MOSFET, IGBT (Insulated Gate Bipolar Transistor) or diodes.

In the semiconductor substrate 10, a first part 2 having a small thickness is formed by grinding and thinning the opposite side of the first surface 2a. By the grinding, the second surface 2b is formed on the opposite side of the first surface 2a. The first surface 2a and the second surface 2b are arranged parallel to XY plane. The thinning of the semiconductor substrate 10 is performed, for example, to reduce the on-resistance of MOSFET by reducing the thickness of the drift layer of MOSFET.

A second part 4 is, for example, a part where the grinding is not performed. As shown in FIG. 2, the second part 4 has an annular (a ring-shaped) form surrounding the second surface 2b. The second part 4 protrudes from the second surface 2b in a direction perpendicular to the second surface (−Z direction). The second part 4 has a top surface 4a and an inner side surface 4b. In other words, the first surface 2a is a surface of the semiconductor substrate 10. The second part 4 is provided to facilitate handling of the semiconductor substrate 10 in the manufacturing process, for example, by keeping the thickness of the peripheral portion of the semiconductor substrate 10 thick.

The first conductive film 12 is provided in contact with the second surface 2b, the top surface 4a of the second part 4, and the inner side surface 4b of the second part 4.

The first conductive film 12 includes a third conductive film 12a and a fourth conductive film 12b. The first conductive film 12 includes, for example, a metallic material. The fourth conductive film 12b corresponds to, for example, a drain electrode of MOSFET. The fourth conductive film 12b includes, for example, Al (aluminum). The third conductive film 12a is, for example, a plating layer formed by plating. The third conductive film 12a includes, for example, an alloy of Ni (nickel) and Au (gold). The third conductive film 12a is, for example, a film to which a bonding material such as solder is bonded when the semiconductor chip is mounted. The fourth conductive film 12b is provided between the third conductive film 12a and the second surface 2b. The fourth conductive film 12b may be in direct contact with the second surface 2b. The fourth conductive film 12b may be indirectly connected to the second surface 2b by providing another film (not shown) between the fourth conductive film 12b and the second surface 2b.

The method of manufacturing the semiconductor device according to the present embodiment is particularly preferably applied when the thickness of the third conductive film 12a is 5 μm or more, the third conductive film 12a includes Ni (nickel), and the fourth conductive film 12b includes Al (aluminum).

The second conductive film 14 includes a fifth conductive film 14a and a sixth conductive film 14b. The second conductive film 14 includes, for example, a metallic material. The sixth conductive film 14b corresponds to, for example, a source electrode or a gate electrode of MOSFET. The sixth conductive film 14b includes, for example, Al (aluminum). The fifth conductive film 14a is, for example, a plating layer formed by plating. The fifth conductive film 14a includes, for example, an alloy of Ni (nickel) and Au (gold). The fifth conductive film 14a is, for example, a film to which a bonding material such as solder is bonded when the semiconductor chip is mounted. The sixth conductive film 14b is provided between the fifth conductive film 14a and the first surface 2a. The sixth conductive film 14b may be in direct contact with the first surface 2a. The sixth conductive film 14b may be indirectly connect to the first surface 2a by providing another film (not shown) between the sixth conductive film 14b and the first surface 2a.

For example, the second conductive film 14 is divided into a plurality of the second conductive film 14 corresponding to the size of the respective semiconductor chip by a photolithography or the like.

Note that embodiments of the first conductive film 12 and the second conductive film 14 are not limited to the above.

FIG. 3 to FIG. 8 are schematic cross-sectional views illustrating the method of manufacturing the semiconductor device according to the present embodiment.

FIG. 9 is a flow chart showing the method of manufacturing the semiconductor device according to the present embodiment.

Figure 3:
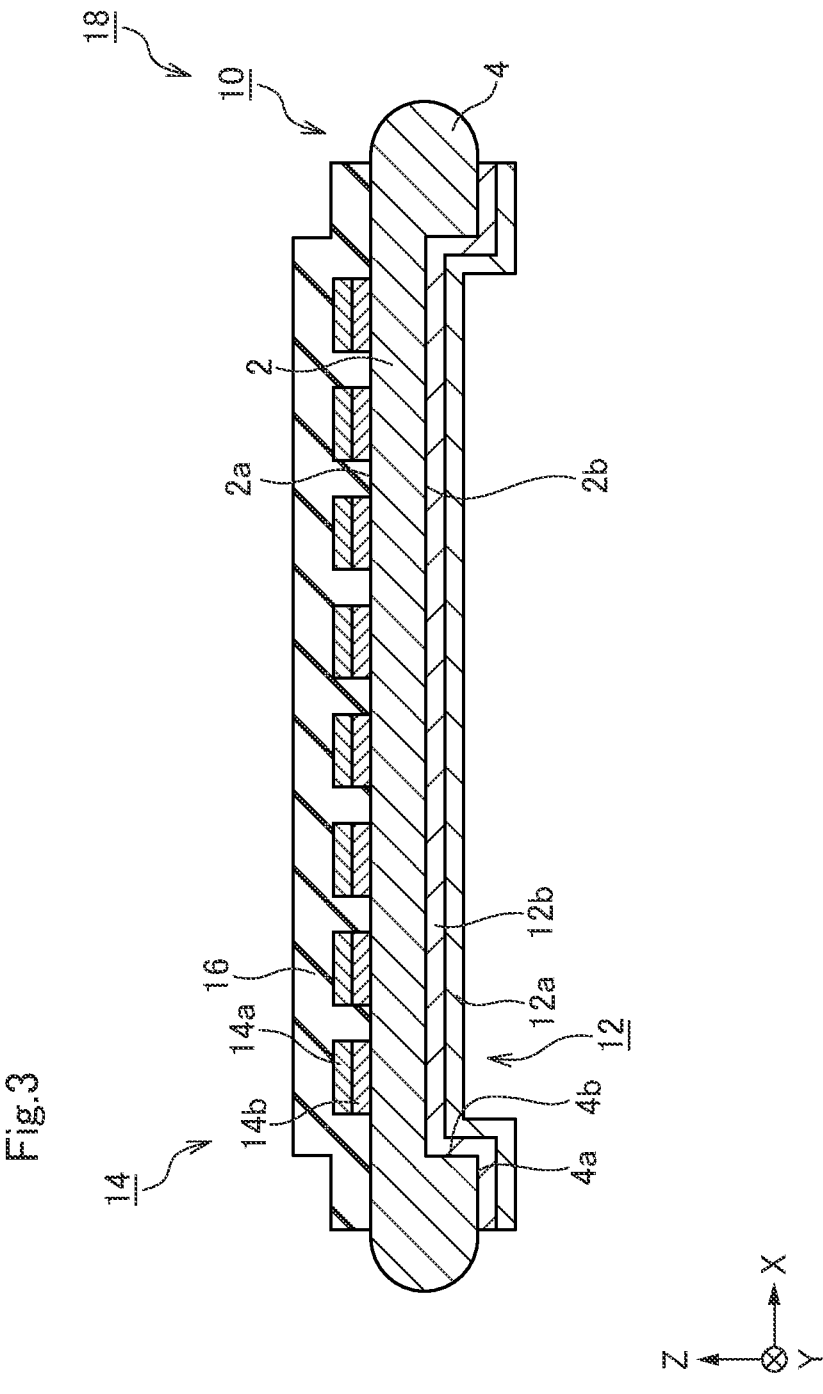
FIG. 3 is a schematic cross-sectional view illustrating a method of manufacturing the semiconductor device according to the first embodiment.

Firstly, a surface protective film (a protective film) 16 is formed on the first surface 2a of the substrate 18 and the second conductive film 14 shown in FIG. 1 (FIG. 3 and S2 of FIG. 9). Here, the surface protective film 16 is not particularly limited, and for example, a protective film including an acryl-based resin, a water-soluble protective film, an organic coating film, or the like can be used. Note that the surface protective film 16 may not be formed.

Figure 4:
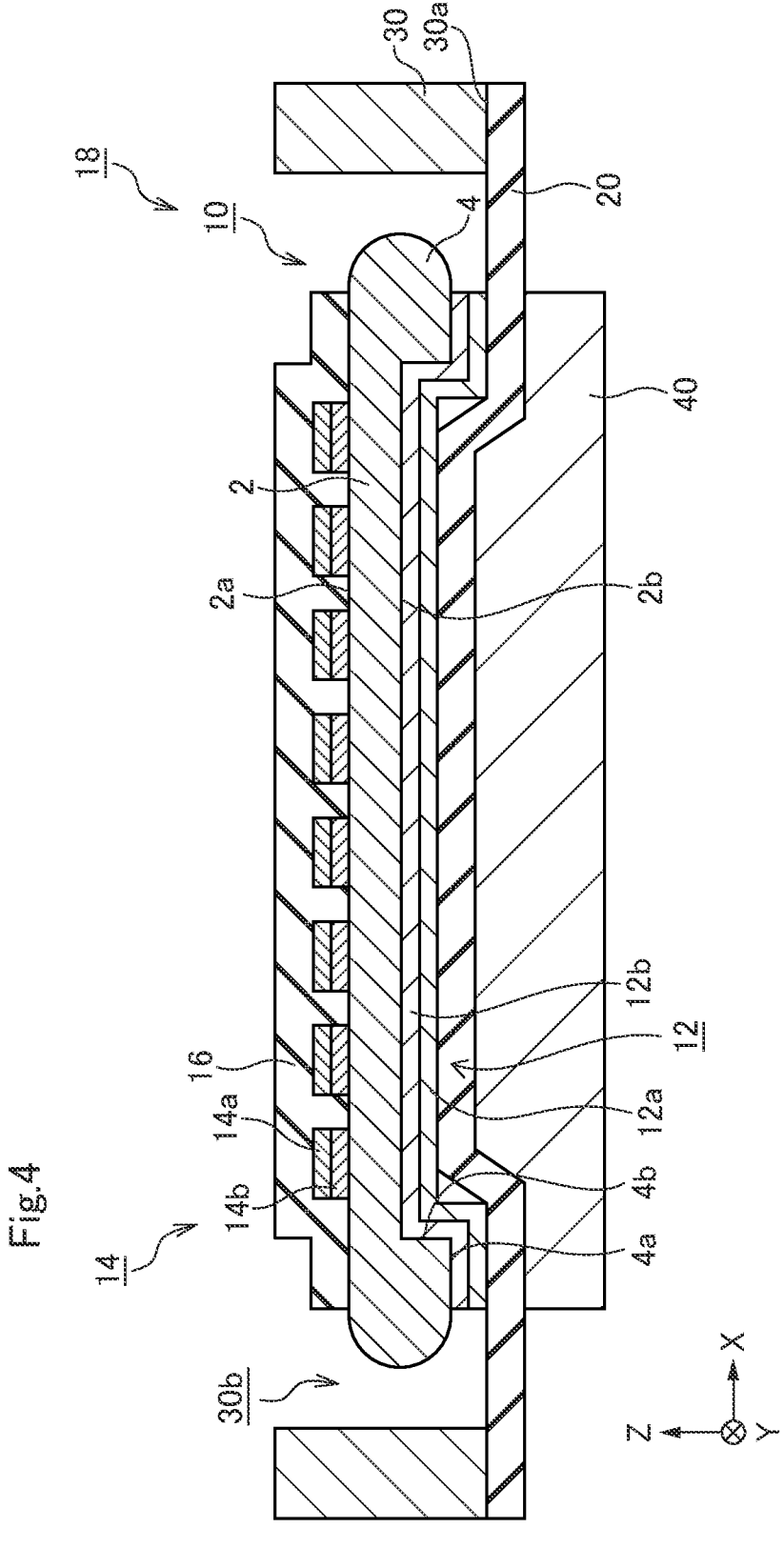
FIG. 4 is a schematic cross-sectional view illustrating the method of manufacturing the semiconductor device according to the first embodiment.

Next, the substrate 18 is fixed to the surface 30a of the annular frame 30 using a dicing sheet (sheet) 20 (FIGS. 4 and S4 of FIG. 9). Specifically, the dicing sheet 20 is attached to the first conductive film 12 and the surface of the annular frame 30a. The annular frame 30 has a through-hole 30b parallel to the Z-direction for holding the substrate 18 in the center. The substrate 18 is disposed in the through hole 30b.

Next, the substrate 18 fixed to the annular frame 30 is placed on the table 40 (FIGS. 4 and S6 of FIG. 9). The table 40 is rotatable in XY plane with the substrate 18 mounted thereon. Here, the surface protective film (the protective film) 16 described with reference to FIGS. 3 and S2 of FIG. 9 may be formed after the annular frame 30 is placed on the table 40.

Next, the semiconductor substrate 10 is polished by pressing a polishing tape 56 against the first surface 2a on the opposite side of the second part 4 (S8 of FIG. 9). At this time, the second conductive film 14 is also polished. In addition, when the surface protective film 16 is provided, before the semiconductor substrate 10 and the second conductive film 14 is polished, the surface protective film 16 is polished. The polishing device 50 is used for polishing with the polishing tape 56. The polishing device 50 has a pressing cylinder 52, a roll 54, the polishing tape 56, a piston rod 58, and a pressing pad 60. The roll 54a and the roll 54b cause the polishing tape 56 to travel in one direction. The pressing pad 60 is provided on the rear side of the polishing tape 56. The pressing pad 60 presses the polishing tape 56 in-Z direction. The pressing cylinder 52 presses the pressing pad 60 against the polishing tape 56 via the piston rod 58. Thus, polishing is performed. While the semiconductor substrate 10 is polished by the polishing tape 56, the semiconductor substrate 10 is rotated in XY plane by the table 40.

By such polishing, the second part 4 is separated from the first part 2 (S10 of FIG. 9).

Figure 5:
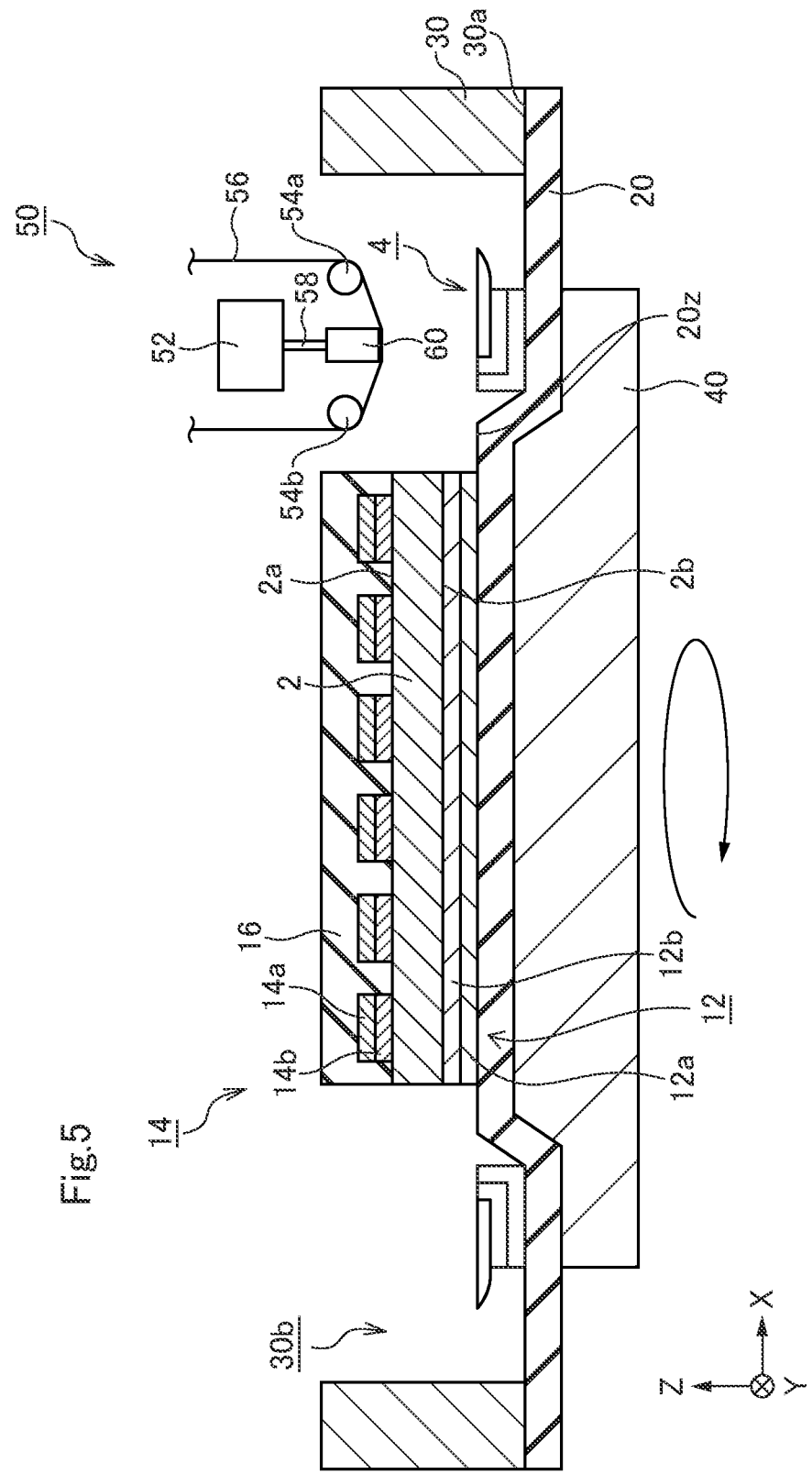
FIG. 5 is a schematic cross-sectional view illustrating the method of manufacturing the semiconductor device according to the first embodiment.

Next, the first conductive film 12 between the first part 2 and the separated second part 4 is polished by pressing the polishing tape 56 against the first conductive film 12 between the first part 2 and the separated second part 4 (S12 of FIG. 9). Then, the first conductive film 12 between the first part 2 and the separated second part 4 is cut and removed. As a result, the upper surface 20z of the dicing sheet 20 is exposed (FIGS. 5 and S14 of FIG. 9).

The polishing of the semiconductor substrate 10 and the polishing of the first conductive film 12 may be performed continuously, for example. Further, for example, after the semiconductor substrate 10 is polished, the first conductive film 12 may be polished at regular intervals.

Figure 6:
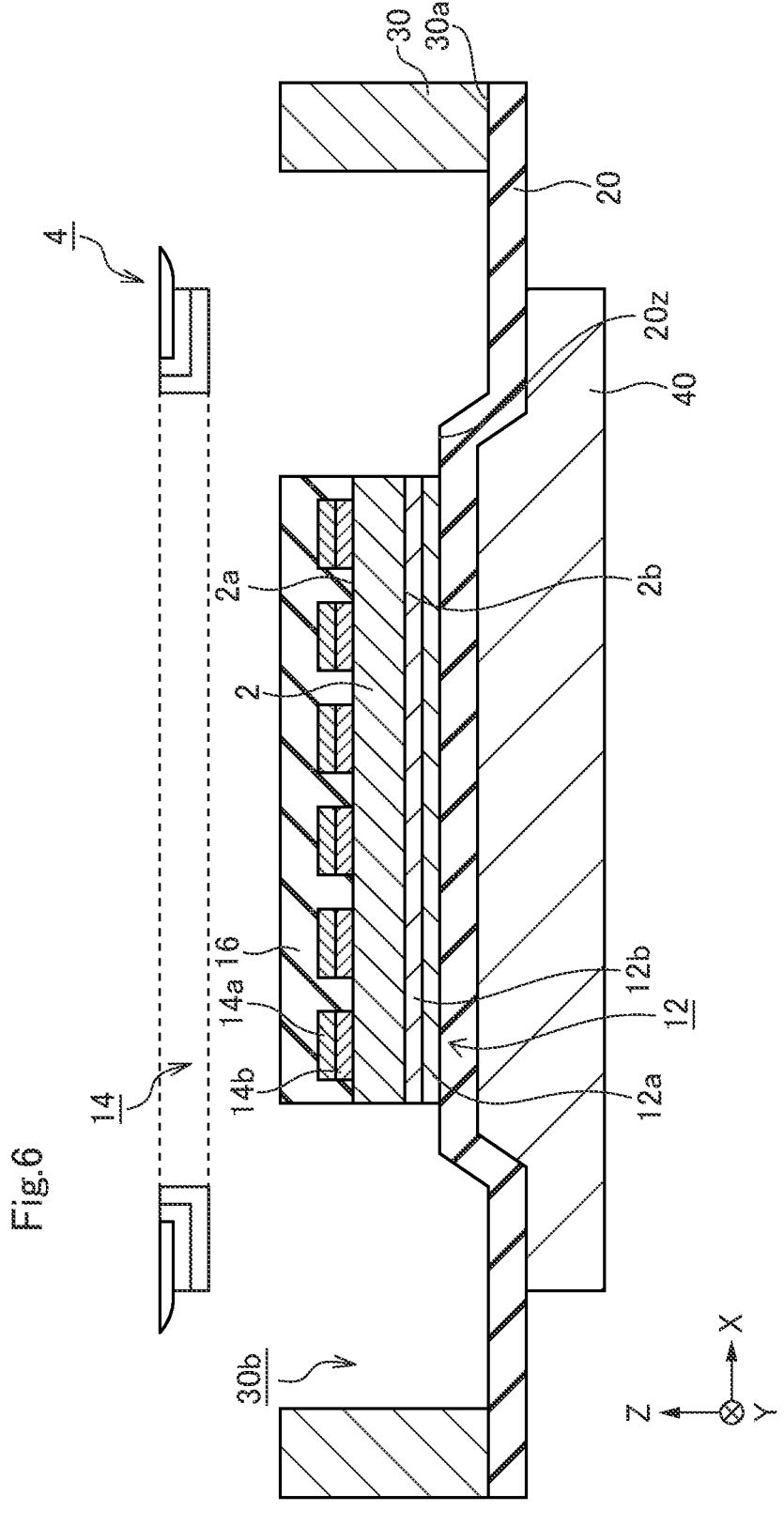
FIG. 6 is a schematic cross-sectional view illustrating the method of manufacturing the semiconductor device according to the first embodiment.

The second part 4 is then peeled off from the dicing sheet 20 and removed (FIGS. 6 and S16 of FIG. 9).

Figure 7:
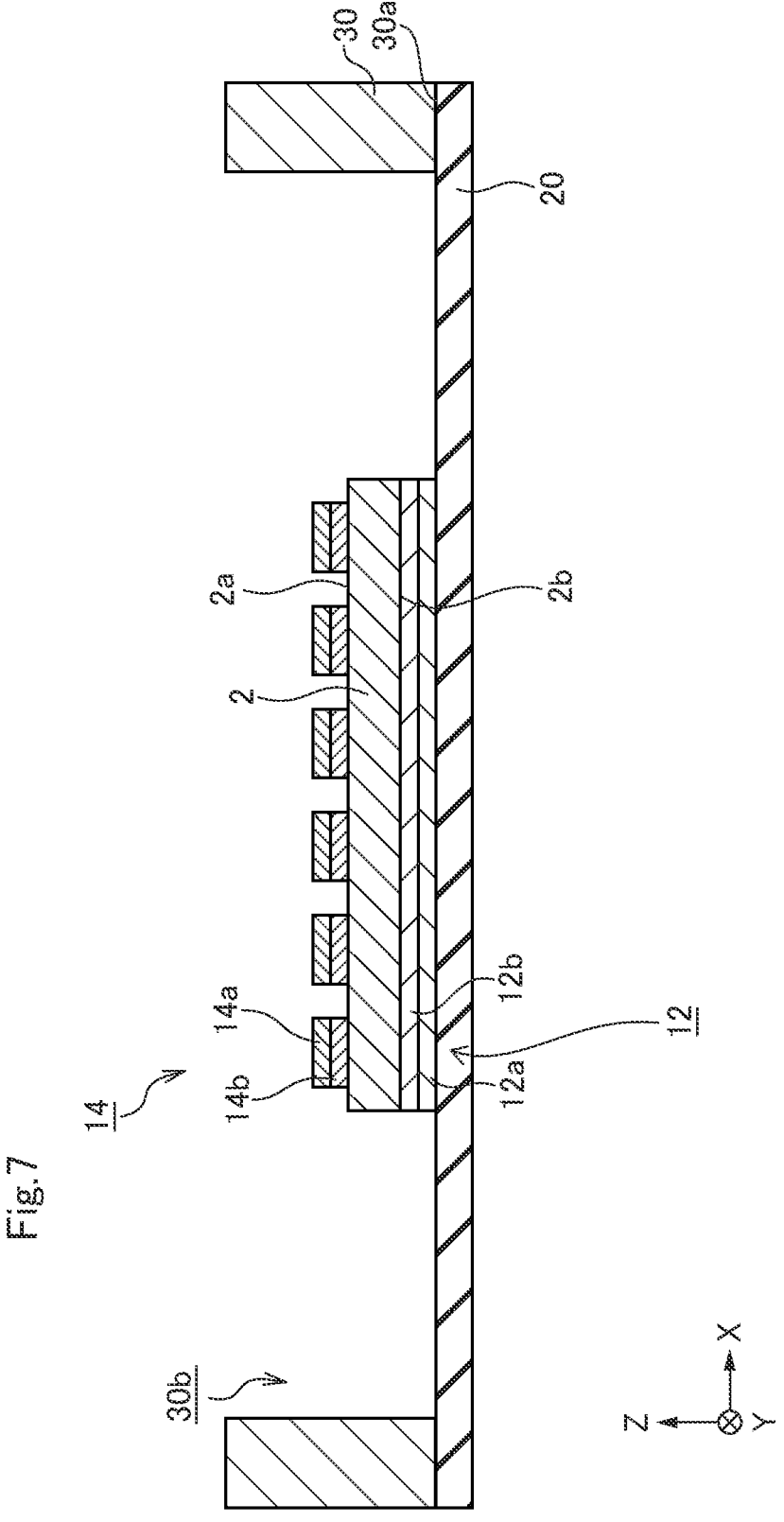
FIG. 7 is a schematic cross-sectional view illustrating the method of manufacturing the semiconductor device according to the first embodiment.

The surface protective film 16 is then removed from the first surface 2a and the second conductive film 14. Also, the first part 2 of the substrate 18 fixed to the annular frame 30 by the dicing sheet 20 is removed from the table 40 (FIGS. 7 and S18 of FIG. 9).

Figure 8:
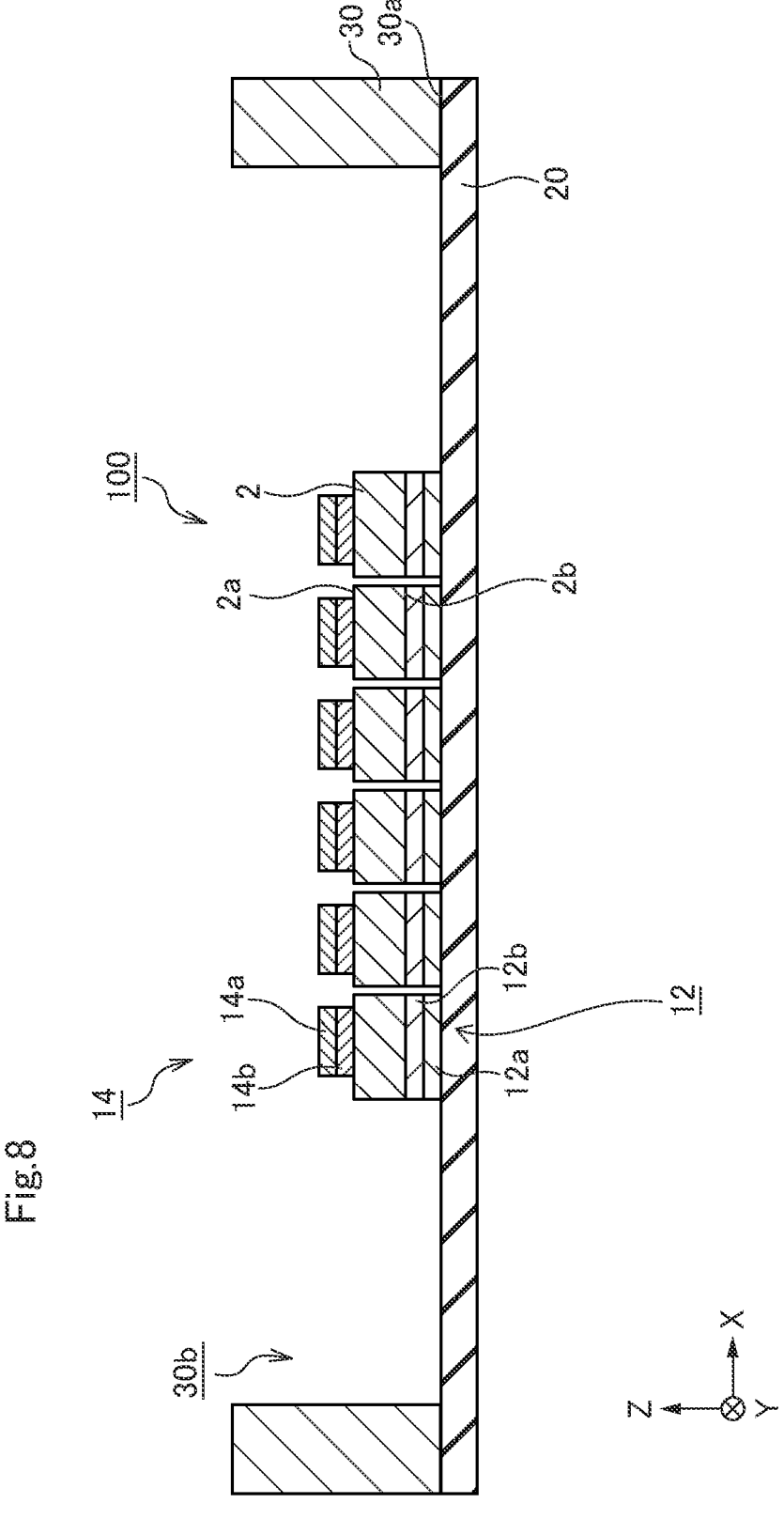
FIG. 8 is a schematic cross-sectional view illustrating the method of manufacturing the semiconductor device according to the first embodiment.

Next, dicing such as blade dicing is performed to separate the first part 2 to obtain the semiconductor device 100 (FIGS. 8 and S20 of FIG. 9).

Next, the operation and advantages of the method of manufacturing the semiconductor device according to the present embodiment will be described.

Figure 10:
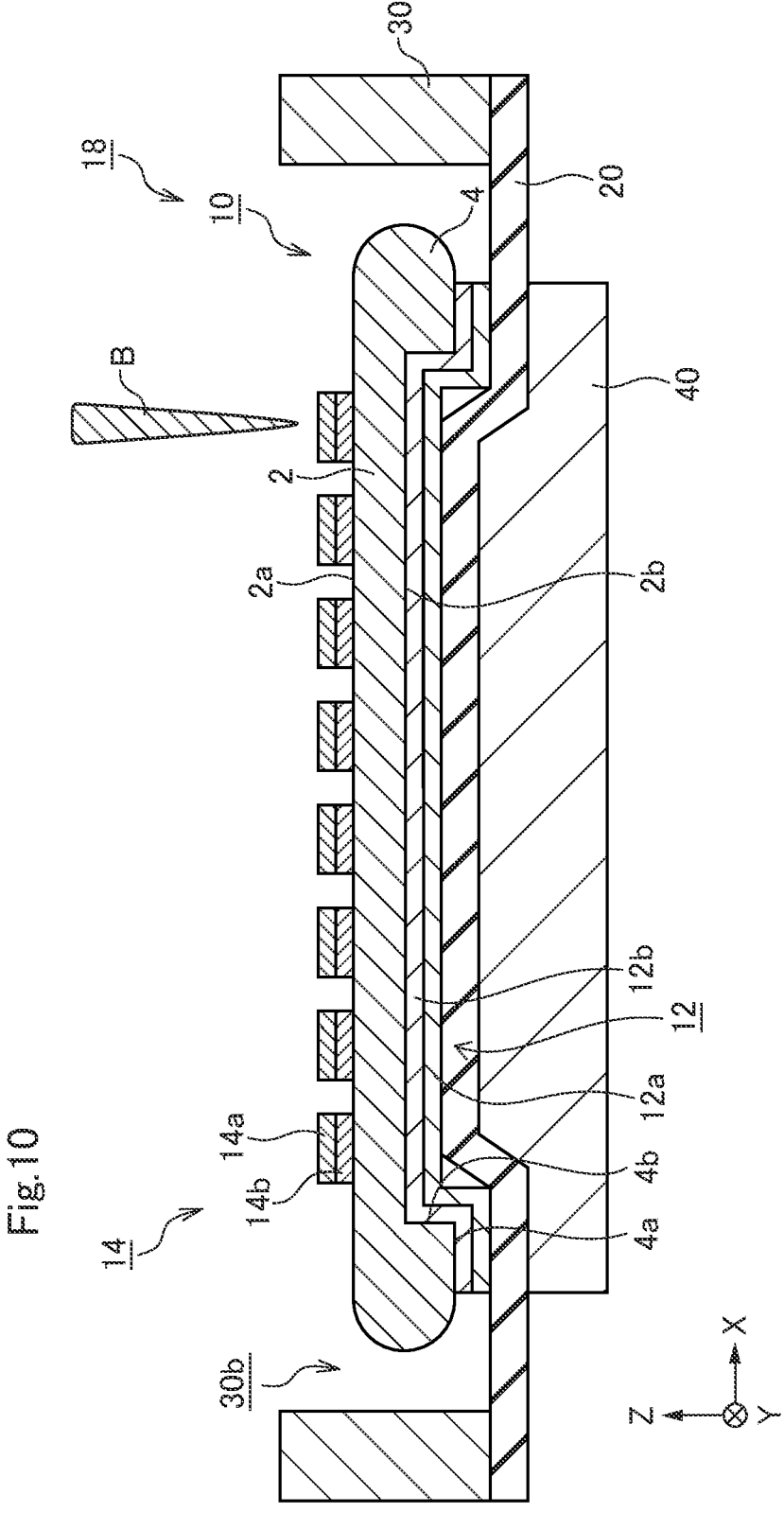
FIG. 10 is a schematic cross-sectional view for explaining the operation and advantages of the semiconductor device according to the first embodiment.

FIG. 10 is a schematic cross-sectional view of the method of manufacturing the semiconductor device according to a comparative embodiment. Separation of the first part 2 and the second part 4 and cutting of the first conductive film 12 are carried out by blade dicing using the blade B, during the rotation of the table 40 in XY plane. In this case, since the blade B is clogged, there is a possibility that the cutting is not performed properly and chipping in which a part of the semiconductor substrate 10 is missed occurs.

In particular, when the first conductive film 12 or the second conductive film 14 includes a metal having a low hardness, such as Cu (copper) or Ag (silver), the blade B is likely to be clogged with a metal having a low hardness, and thus there is a possibility that chipping may occur. In particular, when the diameter of the semiconductor substrate 10 is large, since the amounts of the semiconductor substrate 10, the first conductive film 12, and the second conductive film 14 to be scraped are increased, there is a possibility that chipping may occur. In particular, when the first conductive film 12 has the third conductive film 12a and the second conductive film 14 has the fifth conductive film 14a, there is a possibility that chipping may occur because the thickness of the conductive film to be abraded increases.

Further, burrs of the first conductive film 12 formed by blade dicing easily bite into the dicing sheet 20. Therefore, since the second part 4 is difficult to peel off when the second part 4 is peeled off from the dicing sheet 20, the second part 4 is broken and fragments are scattered in the apparatus, and the inside of the apparatus is contaminated.

Therefore, the method of manufacturing the semiconductor device according to the present embodiment includes: the method of manufacturing a semiconductor device from a substrate and a sheet, the substrate including a semiconductor substrate including a first part including a first surface and a second surface provided on the opposite side of the first surface, and an annular second part surrounding the second surface and protruding from the second surface in a direction perpendicular to the second surface, and a first conductive film provided in contact with a top surface and an inner side surface of the second part, and the second surface, the sheet being attached to the first conductive film provided in contact with the top surface and the inner side surface of the second part, and the second surface; the method comprising: separating the second part from the first part by pressing a polishing tape against the first surface provided on the opposite side of the second part and polishing the semiconductor substrate; and cutting the first conductive film between the first part and the separated second part by pressing the polishing tape against the first conductive film between the first part and the separated second part.

Further, in the method of manufacturing the semiconductor device according to the present embodiment, the first part and the separated the second part are separated from each other by pressing the first conductive film with the polishing tape to polish the first conductive film, whereby the upper surface of the sheet is exposed in the step of cutting the first part and the separated the second part from each other through the first conductive film.

According to the method of manufacturing the semiconductor device of the embodiment, since polishing is performed by pressing the polishing tape, chipping due to clogging of the blade B is less likely to be generated. Therefore, it is possible to provide the method of manufacturing the semiconductor device that can be easily manufactured.

In addition, by applying the polishing by pressing the polishing tape against the second conductive film 14, chipping due to clogging of the blade B is less likely to be generated. Therefore, it is possible to provide the method of manufacturing the semiconductor device that can be easily manufactured.

In addition, it is possible to prevent debris generated from the polishing tape 56 from being deposited on the first surface 2a, by forming the surface protective film 16 on the first surface 2a and the second conductive film 14, and polishing the surface protective film 16.

As described above, according to the method of manufacturing the semiconductor device in the present embodiment, the polishing is performed by pressing the polishing tape. Therefore, when the second part 4 is peeled off from the dicing sheet 20, the burr of the first conductive film 12 is less likely to bite into the dicing sheet 20. Therefore, the second part 4 can be easily peeled off even when the second part 4 is peeled off from the dicing sheet 20.

When the first conductive film 12 includes the third conductive film 12a having a thickness of 5 μm or more and including Ni (nickel), and the fourth conductive film provided between the third conductive film 12a and the second surface 2b and including Al (aluminum), the method of manufacturing the semiconductor device according to the present embodiment is more preferably applied. This is because the thickness of the third conductive film 12a including Ni (nickel) is often relatively thick, and thus chipping by blade dicing is more likely to occur.

According to the method of manufacturing the semiconductor device of the present embodiment, the method of manufacturing the semiconductor device that can be easily manufactured can be provided.

Second Embodiment

A method of manufacturing a semiconductor device of the present embodiment includes: the method of manufacturing a semiconductor device from a substrate and a sheet, the substrate including a semiconductor substrate including a first part including a first surface and a second surface provided on the opposite side of the first surface, and an annular second part surrounding the second surface and protruding from the second surface in a direction perpendicular to the second surface, and a first conductive film provided in contact with a top surface and an inner side surface of the second part, and the second surface, the sheet being attached to the first conductive film provided in contact with the top surface and the inner side surface of the second part, and the second surface; the method comprising: separating the second part from the first part and exposing an upper surface of the first conductive film by pressing a polishing tape against the first surface provided on the opposite side of the second part and polishing the semiconductor substrate; and cutting the first conductive film between the first part and the second part by performing the blade dicing from the upper surface of the exposed first conductive film.

Here, description of the same content as that of the first embodiment is omitted.

Figure 11:
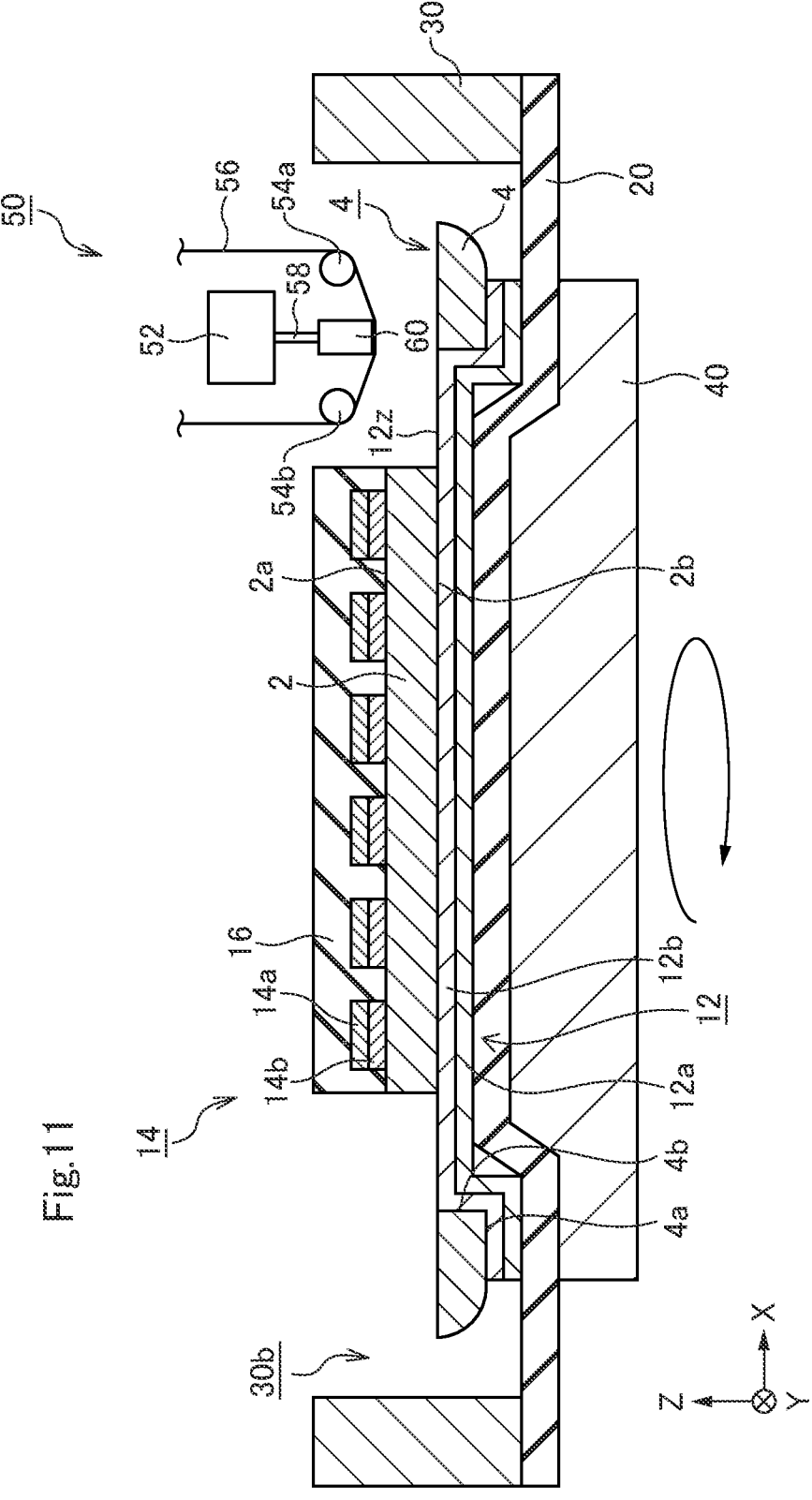
FIG. 11 is a schematic cross-sectional view illustrating the method of manufacturing the semiconductor device according to the second embodiment.
Figure 12:
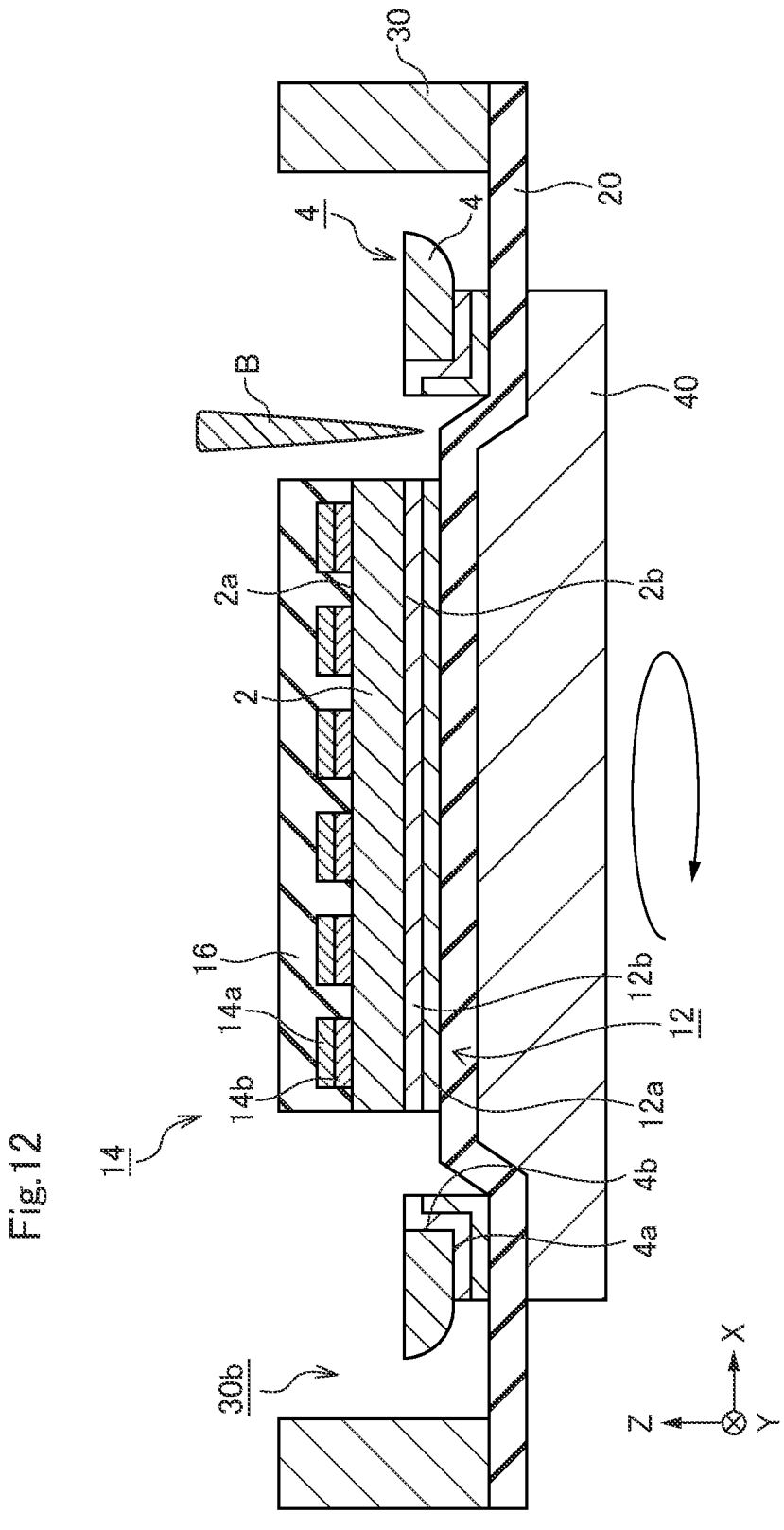
FIG. 12 is a schematic cross-sectional view illustrating the method of manufacturing the semiconductor device according to the second embodiment.

FIG. 11 and FIG. 12 are schematic cross-sectional views showing the method of manufacturing the semiconductor device according to the present embodiment. FIG. 13 is a flow chart showing the method of manufacturing the semiconductor device according to the present embodiment.

In the method of manufacturing the semiconductor device according to the present embodiment, the method is the same as the method according to the first embodiment, up to the point of polishing the semiconductor substrate 10 by pressing the polishing tape 56 against the first surface 2a on the opposite side of the second part 4 (S8 of FIG. 13). Then, the second part 4 is separated from the first part 2 and the upper surface 12z of the first conductive film 12 between the first part 2 and the second part 4 is exposed (FIGS. 11 and S10' of FIG. 13).

Next, blade dicing is performed from the upper surface 12z of the exposed first conductive film 12 while the table 40 is rotated in XY plane (S12' of FIG. 13). The first conductive film 12 between the first part 2 and the separated second part 4 is cut by the blade dicing (S14').

The subsequent steps are the same as those of the method of manufacturing the semiconductor device according to the first embodiment.

In the method of manufacturing the semiconductor device according to the first embodiment, when the first conductive film 12 between the first part 2 and the separated second part 4 are pressed by the polishing tape 56 to polish the first conductive film 12, there is a possibility that the polishing will proceed to the dicing sheet 20. Therefore, according to the method of manufacturing the semiconductor device of the present embodiment, the upper surface 12z of the first conductive film 12 is exposed by polishing the semiconductor substrate 10 with the polishing tape 56. Thereafter, the first conductive film 12 is cut by blade dicing. In other words, the first conductive film 12 is not polished by the polishing tape 56 as much as possible.

According to the method of manufacturing the semiconductor device of the present embodiment, polishing of the dicing sheet 20 by the polishing tape 56 is suppressed.

According to the method of manufacturing the semiconductor device of the present embodiment, the semiconductor substrate 10 is not cut by the blade dicing. The first conductive film 12 is cut by the blade dicing. When the blade dicing is performed on both the semiconductor substrate 10 and the first conductive film 12, it is difficult to find a condition for suppressing generation of burrs in the first conductive film 12. However, if the blade dicing is not performed for the semiconductor substrate 10 but is performed only for the first conductive film 12, it is feasible to find a condition for suppressing generation of burrs in the first conductive film 12.

According to the method of manufacturing the semiconductor device of the present embodiment, the method that can be easily manufactured can be provided.

While certain embodiments have been described, these embodiments have been presented by way of example only, and are not intended to limit the scope of the inventions. Indeed, the method of manufacturing the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A method of manufacturing a semiconductor device from a substrate and a sheet,
   the substrate including
      a semiconductor substrate including
         a first part including a first surface and a second surface provided on the opposite side of the first surface, and
         an annular second part surrounding the second surface and protruding from the second surface in a direction perpendicular to the second surface, and
      a first conductive film provided in contact with a top surface and an inner side surface of the second part, and the second surface,
   the sheet being attached to the first conductive film provided in contact with the top surface and the inner side surface of the second part, and the second surface;
   the method comprising:
   separating the second part from the first part by pressing a polishing tape against the first surface provided on the opposite side of the second part and polishing the semiconductor substrate; and
   cutting the first conductive film between the first part and the separated second part by pressing the polishing tape against the first conductive film between the first part and the separated second part.

2. The method of manufacturing the semiconductor device according to claim 1, wherein
   the substrate further includes a second conductive film provided in contact with the first surface, and
   in the separating step, the second conductive film is polished.

3. The method of manufacturing the semiconductor device according to claim 1, wherein
   in the cutting step, an upper surface of the sheet is exposed.

4. The method of manufacturing the semiconductor device according to claim 1, wherein
   the semiconductor substrate further includes a protective film provided on the first surface, and
   the method further comprising:
   polishing the protective film provided on the first surface provided on the opposite side of the second part, before the separating step.

5. The method of manufacturing the semiconductor device according to claim 1, further comprising:
   peeling off the second part from the sheet after the cutting step.

6. The method of manufacturing the semiconductor device according to claim 1, wherein the first conductive film includes a third conductive film having a thickness of 5 μm or more and the third conductive film includes Ni (nickel), and a fourth conductive film provided between the third conductive film and the second surface and the fourth conductive film includes Al (aluminum).

7. A method of manufacturing a semiconductor device from a substrate and a sheet, the substrate including a semiconductor substrate including a first part including a first surface and a second surface provided on the opposite side of the first surface, and an annular second part surrounding the second surface and protruding from the second surface in a direction perpendicular to the second surface, and a first conductive film provided in contact with a top surface and an inner side surface of the second part, and the second surface, the sheet being attached to the first conductive film provided in contact with the top surface and the inner side surface of the second part, and the second surface;

the method comprising:

separating the second part from the first part and exposing an upper surface of the first conductive film by pressing a polishing tape against the first surface provided on the opposite side of the second part and polishing the semiconductor substrate; and cutting the first conductive film between the first part and the second part by performing the blade dicing from the upper surface of the exposed first conductive film.

8. The method of manufacturing the semiconductor device according to claim 7, wherein the substrate further includes a second conductive film provided in contact with the first surface, and in the separating step, the second conductive film is polished.

9. The method of manufacturing the semiconductor device according to claim 7, wherein the semiconductor substrate further includes a protective film provided on the first surface, and the method further comprising:

polishing the protective film provided on the first surface provided on the opposite side of the second part, before the separating step.

10. The method of manufacturing the semiconductor device according to claim 7, further comprising:

peeling off the second part from the sheet after the cutting step.

11. The method of manufacturing the semiconductor device according to claim 7, wherein the first conductive film includes a third conductive film having a thickness of 5 μm or more and the third conductive film includes Ni (nickel), and a fourth conductive film provided between the third conductive film and the second surface and the fourth conductive film includes Al (aluminum).

* * * * *